United States Patent
Baik et al.

(10) Patent No.: US 10,361,556 B2
(45) Date of Patent: Jul. 23, 2019

(54) SHORT-CIRCUIT DETECTION FOR HALF-BRIDGE PEAK-AND-HOLD PRE-DRIVER

(71) Applicant: Continental Automotive Systems, Inc., Auburn Hills, MI (US)

(72) Inventors: Chung Heum Baik, Rochester Hills, MI (US); Mauricio Eduardo Hernandez-distancia, Rochester Hills, MI (US); Eugene Tavares, Rochester, MI (US); Ajay H Patil, Auburn Hills, MI (US); Daniel Kisslinger da Silva, Rochester, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 225 days.

(21) Appl. No.: 15/333,329

(22) Filed: Oct. 25, 2016

(65) Prior Publication Data
US 2018/0115153 A1    Apr. 26, 2018

(51) Int. Cl.
| H02H 9/00 | (2006.01) |
| --- | --- |
| H02H 9/02 | (2006.01) |
| G01R 31/02 | (2006.01) |
| H02H 7/00 | (2006.01) |
| F02D 41/22 | (2006.01) |
| F02D 41/20 | (2006.01) |

(52) U.S. Cl.
CPC ............ *H02H 9/025* (2013.01); *F02D 41/20* (2013.01); *F02D 41/221* (2013.01); *G01R 31/02* (2013.01); *G01R 31/025* (2013.01); *H02H 7/005* (2013.01); *F02D 2041/2058* (2013.01); *F02D 2041/2072* (2013.01); *F02D 2041/2093* (2013.01); *Y02T 10/40* (2013.01)

(58) Field of Classification Search
CPC ....................................... H02H 9/025
See application file for complete search history.

(56) References Cited

U.S. PATENT DOCUMENTS

| 5,932,976 | A | * | 8/1999 | Maheshwari | ........ | H05B 41/288 |
| --- | --- | --- | --- | --- | --- | --- |
| | | | | | | 315/174 |
| 6,232,781 | B1 | * | 5/2001 | Goser | .................. | F02D 41/221 |
| | | | | | | 324/415 |
| 6,535,399 | B2 | * | 3/2003 | Gu | ........................ | H03F 1/0227 |
| | | | | | | 330/297 |
| 8,488,283 | B2 | * | 7/2013 | Ando | ................. | H03K 17/0822 |
| | | | | | | 361/18 |
| 2016/0265498 | A1 | | 9/2016 | Puckett et al. | | |

FOREIGN PATENT DOCUMENTS

| JP | 2014060266 A | 4/2014 |
| --- | --- | --- |
| KR | 20090052043 A | 5/2009 |

OTHER PUBLICATIONS

International Search Report and Written Opinion of the International Search Authority dated Feb. 2, 2018 for corresponding PCT application No. PCT/US2017/058290.

* cited by examiner

*Primary Examiner* — Stephen W Jackson

(57) ABSTRACT

Current sensors measure current flowing into and out of an inductive load such as a solenoid coil and provide signals to a processor when the difference between the two measured currents exceeds a threshold. A solenoid coil and electronic devices driving it are protected from damage caused by a short circuit at the connections to the coil.

11 Claims, 3 Drawing Sheets

SHORT-CIRCUIT DETECTION FOR HALF-BRIDGE PEAK-AND-HOLD PRE-DRIVER

BACKGROUND

Solenoids typically require a relatively large current to energize and a lesser or smaller current to stay closed after being energized. Well-known circuits used to drive solenoids include a half-bridge peak-and-hold driver. Some such circuits modulate the width or time duration of current pulses provided to a solenoid in order to energize the solenoid, i.e., provide a actuation current, and hold it closed, i.e., provide a holding current.

A problem with prior art half-bridge peak and hold drivers is their inability to detect short circuits to the battery voltage or to ground or the driver is on. More particularly, the high side of a solenoid coil is inadvertently connected to the battery voltage directly, which is also known as a short-circuit-to-battery fault, the solenoid as well as electronics that drive it can be damaged. Similarly, when the low side of the coil is short circuited to ground, the solenoid and electronics that drive it can also be damaged. An apparatus and method for detecting short circuits of the high side and low side of an inductive load, such as a solenoid, driven by a half-bridge peak and hold driver, would be an improvement over the prior art.

DETAILED DESCRIPTION

Figure 1:
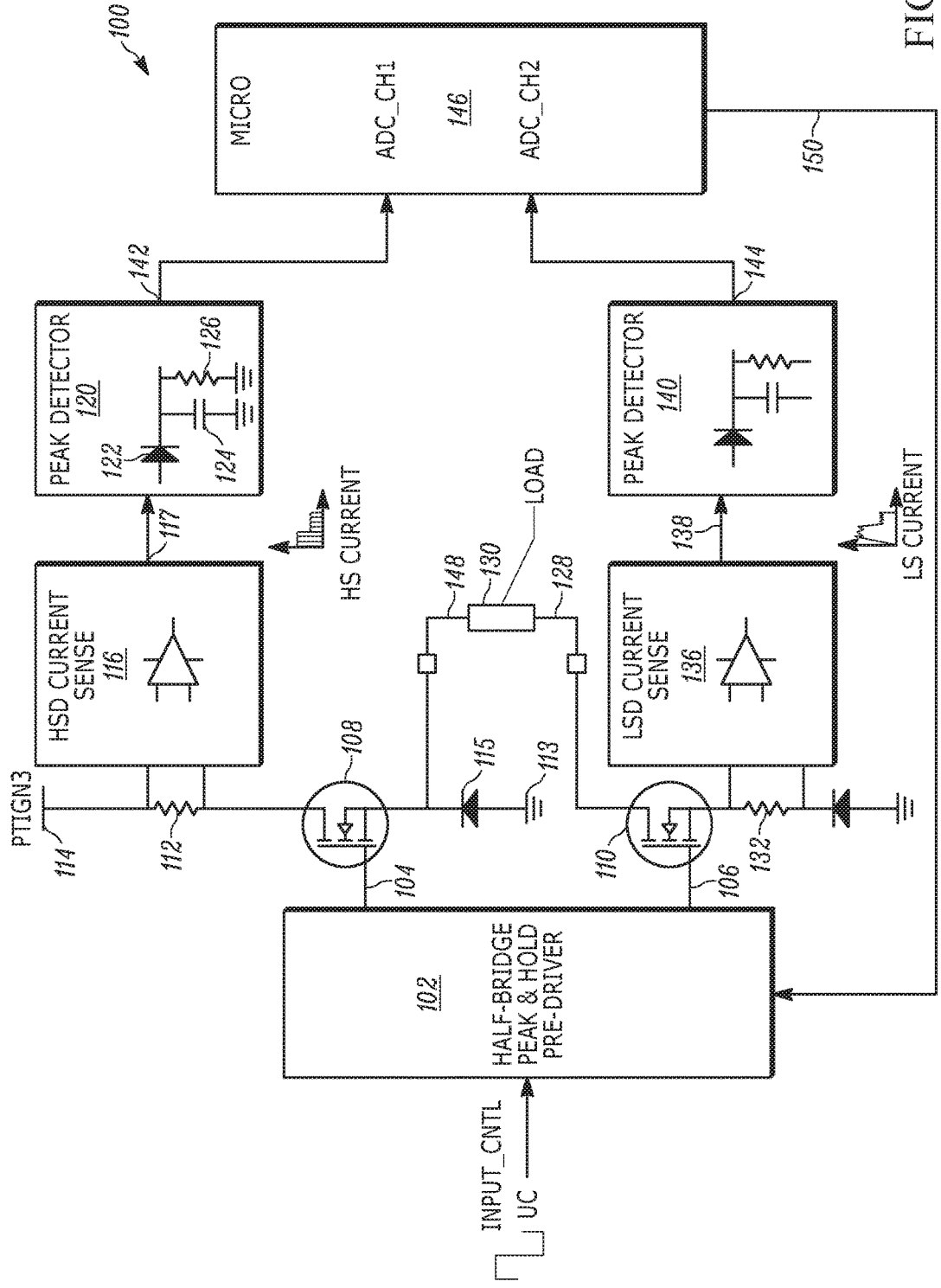
FIG. 1 is a block diagram of an apparatus for detecting faults on outputs of a half-bridge peak-and-hold pre-driver having a high side output port and a low side output port.

FIG. 1 is a block diagram of a preferred embodiment of an apparatus for detecting faults on the outputs of a half-bridge, peak-and-hold driver (referred to simply as a "driver" hereinafter). The apparatus 100 comprises, of course, a half-bridge peak-and-hold pre-driver 102, well-known in the art, further description of which is omitted in the interest of brevity.

The driver 102 has a "high side" output 104 and a low side output 106, so named because the high side output 104 provides a high or positive output voltage from which current is provided to a load; the low side output 106 provides a lower, ground or negative potential voltage, to which current from the load returns. The outputs 104, 106 are connected to corresponding field effect transistors (FETs) 108 and 110 which are considered herein to be switches, which are turned on and off responsive to the voltages output from the high side and low side outputs of the driver 102. The FETs thus provide a pulse-width modulated current to the load.

The first switch or transistor 108 is connected between a small-valued resistance 112 and a reference potential 113, through a diode 115. The resistance is small-valued, i.e., typically less than 10 ohms and provides a voltage drop across it, proportional to the current flowing through it. The first resistor 112 is considered herein to be part of a current sensor, which is considered to be a device which senses or measures the amount of current flowing through it and provides an output voltage 117 representing or corresponding to the magnitude of the current flowing to the load.

A conventional operational amplifier 116 is connected across the resistor 112. The amplifier 116 amplifies the voltage across the small resistor 112 due to the current flowing through the resistor 112 and provides an output voltage, the magnitude of which corresponds to the current flowing through the resistor 112. The output 118 of the amplifier 116 is provided to a peak detector 120.

The peak detector 120 comprises a forward biased diode 122, the cathode of which is connected to a capacitance 124 that is connected in parallel with a resistance 126. The diode 122 thus allows current to flow in one direction, which it will do, as long as the voltage on the anode of the diode 122 exceeds the cathode voltage. The capacitor 124 thus "stores" the voltage peak from the amplifier, minus the voltage drop across the diode 122. The parallel-connected resistance 126 discharges the capacitor 124, allowing successive variations in the output voltage from the amplifier to be stored and then read by the processor.

The low side output 106 of the driver 102 is also connected to a field effect transistor 110, connected between the low side 128 of a load 130 and a second, small valued resistor 132. The second low valued resistor 132 is connected between the second switch 110 and ground or a reference potential 113 for the apparatus 100.

Similar to the first switch 108, the second switch 110 is turned on and off by voltages provided to it by the driver 102. When current is flowing through the second small valued resistor 132, a second voltage amplifier 136 provides its output voltage 138 to a second peak detector 140.

The outputs 142 and 144 of the first and second peak detectors 120 and 140 respectively are provided to a microprocessor 146. The microprocessor is considered herein to be a comparator in that it takes the two analog voltages of the peak detectors 120 and 140, converts them to digital values, compares the digital values to each other and based upon that comparison, turns off or turns on the driver 102 by a control signal output 150 provided to the driver 102.

As is known in the art, the high side output 104 of the driver 102 is a pulse-width modulated voltage. It changes the duty cycle and frequency of the current flowing through the resistor 112 the load 130 in order to provide a current sufficient to close or actuate the load 130 and, after the solenoid is closed, reduce the current to a lower value necessary only to hold the solenoid closed. In the event that the high side 148 of the load 130 is shorted to battery or the low side 128 is shorted to ground, the apparatus 100 depicted in FIG. 1 is able to shut off the driver 102 by determining when the current through the high side 148 of the load 130 exceeds or is less than the current flowing through the low side 128.

A determination that the current flowing through the high side exceeds the current flowing through the low side by an improper amount is determined by the instantaneous or near-instantaneous value of the peak current through the high side resistance 112 versus the peak current passing through the low side resistance 132. If that difference exceeds a pre-determined, design-choice value, the microprocessor 146 provides an output signal 150 to the driver 102 turning the driver off, isolating the load 130 from the battery 114 and protecting it from damage.

Figure 2:
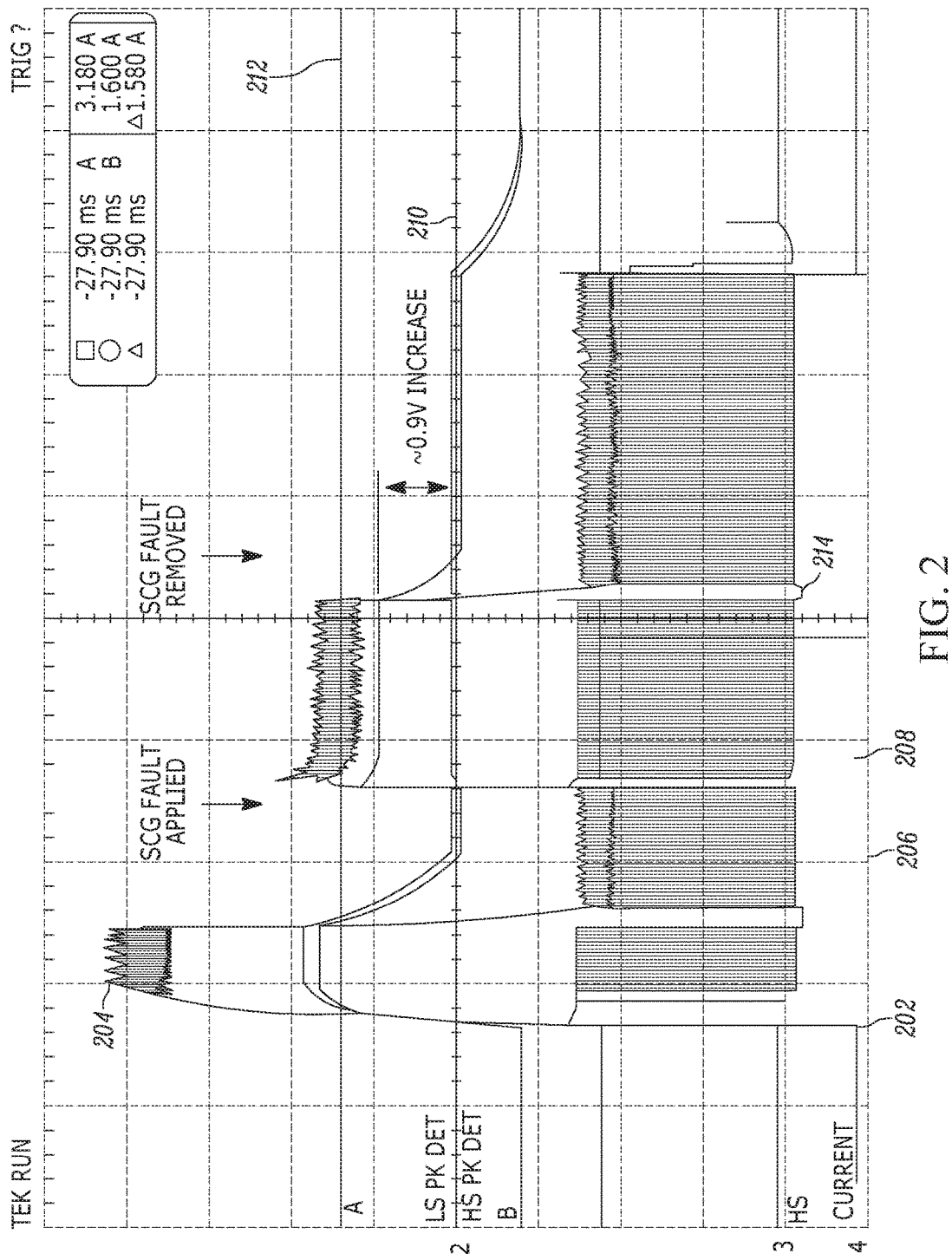
FIG. 2 depicts the outputs of current sensors before and after a short circuit ground fault is applied and removed from a load.

FIG. 2 depicts an oscilloscope trace of the voltages in the circuit. Changes in the voltages are depicted as a function of time. Beginning a time t=0 no current is flowing through the load 130, because the high and low outputs 104 and 106 respectively are off. As a result, the switches 108 and 110 are not conducting. No current flows through the small valued current sense resistors 112 and 132. As a result, the output voltages from the amplifiers 116 and 136 are zero.

At a later time, t=1, the high side output 104 goes active or high, which turns on the first switch 108. (A normal operation, the low side switch 110 is always on; the current to the load 130 is provided by manipulating only the first switch 108.)

After the first switch 108 is turned on at t=1, current, identified by reference numeral 202, spikes upwardly as shown. The output voltages 118 and 138 from the current sensing circuitry rises to a maximum value 204 until the high side output 104 is shut off at t=206. Current through the load decreases quite quickly. The output voltages from the peak detectors decreases exponentially as should be expected from the parallel capacitances and resistances 124 and 126.

At t=3, 208 the high side output 104 is activated again at the same time that a short circuit to ground fault of the low side 128 of the load 130 is applied. A difference in the output voltages from the peak detectors 120 and 140 is represented as a line identified by reference numeral 210, which is below a threshold value 212. The current through the load, represented by the trace 202 stays at zero owing to the fact that the comparator 146 turned off the driver circuit and effectively disconnected the load from the battery voltage.

Figure 3:
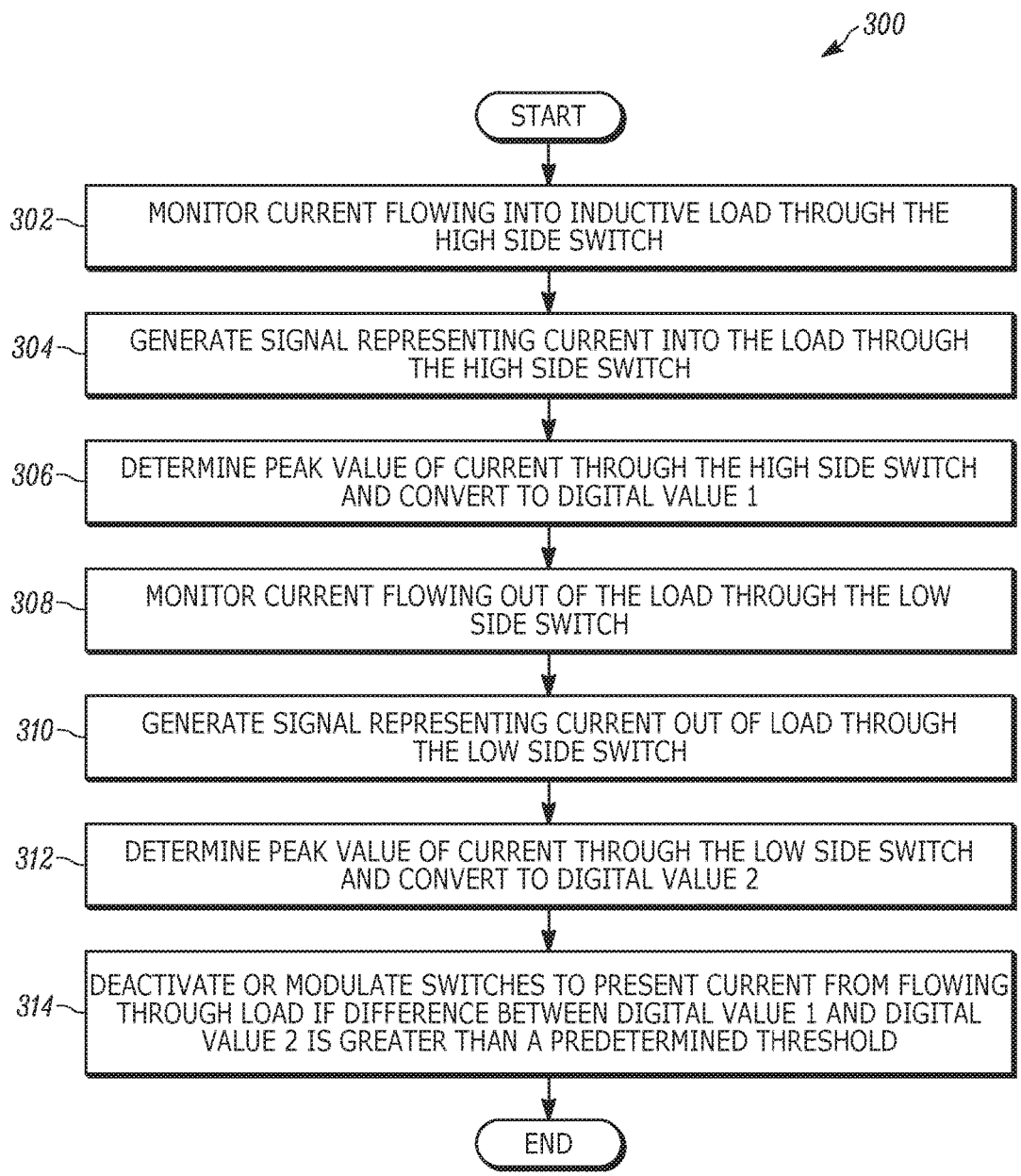
FIG. 3 depicts steps of a method of detecting faults on the outputs of a half-bridge, peak-and-hold driver having a high side output and a low side output.

Referring now to FIG. 3, a method 300 of detecting faults on the outputs of a half-bridge, peak-and-hold driver having high side and low side outputs as shown. At a first step 302, current flowing into a load from a power supply is "monitored." Monitoring the current flowing into an inductive load, such as a solenoid, can be accomplished using the circuit shown in FIG. 2. The current flowing into the load is modulated by pulse width modulating a control voltage to the switch connected between the power supply and the load. During the time that the switch is on, the current through the load will thus have a value that peaks responsive to the impedance "seen" by the battery. Monitoring the current flow into the load thus enables peak values of the current to be detected and held by a peak detector such as the one depicted in FIG. 1.

At a second step 304, a signal representing the load current is generated and which represents the instantaneous current flowing into the load when the switch is turned on by the driver. In the embodiment shown in FIG. 1, the load current signal is an analog voltage. That voltage is converted to a digital value by the comparator or microprocessor.

At a third step 306, a determination of the load current peak is made by the peak detector and the conversion of that analog voltage to a digital value.

At step 308, as well as steps 310 and 312, the current flowing through the low side of the load is monitored, a corresponding signal generated and the peak value of its current determined as well.

At step 314, a signal is provided to the control switches, i.e. the switches in series between a battery in the load and the loading ground that either reduces the amount of current flowing through them or completely shuts them off, protecting the solenoid coil from damage.

The voltage difference between the high side (HS) and low side (LS) peak detector outputs, which is the threshold for detecting a short circuit fault condition, should be set to a level that is adequate to protect both the load and the hardware components (e.g. MOSFET switches and shunt resistors) during a faulted condition. For instance. if the load needs to be regulated with 1.5 A of average current during the hold phase and cannot withstand more than 3.5 A of average current for any "long" period of time (e.g. >1 sec), then the voltage difference between high side and low side peak detector outputs should be set to a level that reflects the load current difference of less than 2.0 A in order to make sure that the maximum average load current does not exceed 3.5 A limit. The load current difference value of 2 A is represented by the voltage difference value of the outputs of HS and LS peak detectors, which is mainly determined by the value of the shunt resistors and the gain value of the current sense amplifiers. Therefore, with 10 mohm shunt resistor with the gain value of 32 for the current sense amplifier, the 2 A current difference value is equal to 2 A*10 mohm*32=0.64V difference between the HS and LS peak detector output voltages, and this voltage value is converted into a representative digital A/D converter value by the processor. Note that the voltage drop across the diode in the peak detectors does not affect the threshold value since they cancel out each other. Also, note that the shunt resistor value and the gain value of the current sense amplifiers on both HS and LS must be the same.

The foregoing description is for purposes of illustration only. The true scope of the invention is set forth in the following claims.

What is claimed is:

1. An apparatus for detecting faults on outputs of a half-bridge, peak-and-hold pre-driver (driver) having a high side output and a low side output, the apparatus comprising:

a first current sensor coupled between a first switch, which turns on and off responsive to signals received by the first switch from the driver, and a power supply, the first current sensor providing a first signal representing current flowing into a load from the power supply when the first switch is on;

a first peak detector coupled to the first current sensor and providing a first output signal representing a substantially instantaneous peak value of current flowing into the load from the power supply when the first switch is on;

a second current sensor coupled between a second switch, which turns on and off responsive to signals received by the second switch from the driver, and a reference potential for the power supply, the second current sensor providing a second signal representing current flowing out of the load and into the reference potential;

a second peak detector coupled to the second current sensor and providing a second output signal corresponding to a substantially instantaneous peak value of current flowing out of the load and into the reference potential node;

a comparator coupled to the first and second peak detectors and coupled to the driver, the comparator configured to turn off the driver within a predetermined amount of time, when the first output signal from the first peak detector exceeds the second output signal from the second peak detector by an amount greater than a first predetermined threshold amount.

2. The apparatus of claim 1, wherein the load comprises a solenoid, which requires a first actuating current having a first magnitude and a second, lesser hold-in current, and wherein the half-bridge, peak-and-hold pre-driver is configured to provide the first and second currents to the solenoid by turning the first switch on and off using pulse-width modulated signals provided to the first switch.

3. The apparatus of claim 2, wherein the first and second current sensors each comprise an amplifier connected across a shunt resistor, the shunt resistor being connected in series with the load, the amplifier connected across the shunt resistor providing an output voltage representing the substantially instantaneous magnitude of the current flowing through the shunt resistor.

4. The apparatus of claim 3, wherein the first switch is coupled between a high side of the load and the first shunt resistor, the first switch switching current to the load, on and off, responsive to control signals provided to the first switch by the driver.

5. The apparatus of claim 4, wherein gate terminals of the first and second switches are connected to outputs of the driver.

6. The apparatus of claim 1, wherein the comparator comprises a processor.

7. The apparatus of claim 6, wherein the processor has at least one analog-to-digital (A/D) converter and wherein the processor is configured to:
receive signals from the first and second peak detectors;
convert said received signals to corresponding digital values;
compare the digital values corresponding to the signals from the peak detectors; and
provide a control signal to the driver, which causes the driver to shut off at least one of the first and second switches when the current through the load exceeds a predetermined value.

8. The apparatus of claim 1, wherein the first and second peak detectors each comprise a diode, which is connected between a current sensor and, a capacitance and resistance connected in parallel to each other, the parallel connected resistance and capacitance being connected between the diode and the reference potential.

9. A method of detecting faults on the outputs of a half-bridge, peak-and-hold pre-driver (driver) having a high side output and a low side output, the method comprising:
monitoring current flowing into a load from a power supply, the current from the power supply and flowing into the load passing through a first switch, which turns on and off to modulate the current flowing into the load, responsive to signals provided to the first switch by the driver,
generating a first load current signal, which represents the current flowing into the load when the first switch is on;
determining a peak in the magnitude of the current flowing through the load when the first switch is on;
monitoring current flowing from the load into a reference potential through a second switch, which turns on and off responsive to signals provide to the second switch by the driver,
generating a second load current signal representing the current flowing from the load to the reference potential when the second switch is on;
determining a peak in the magnitude of the current flowing out of the load and into the reference potential when the second switch is on; and
providing signals to the first and second switches that reduces or shuts off current passing through them, when a peak in the magnitude of the current flowing into the load from the power supply while the first switch is on, exceeds by a predetermined amount, a peak in the magnitude of the current flowing out of the load and into the reference potential when the second switch is on.

10. The method of claim 9, wherein the load comprises a solenoid, which requires a first closing current and second, smaller hold-in current, wherein the step of monitoring current flowing into the load comprises determining the magnitude of the current flowing into the solenoid responsive to turning the first switch on, using pulse-width modulated signals provided to the first switch by the driver.

11. The method of step 9, wherein determining a peak in the magnitude of the current flowing through the load when the first switch is on is performed by a first peak detector, wherein determining a peak in the magnitude of the current flowing out of the load and into the reference potential when the second switch is on is performed by a second peak detector, wherein the first and second peak detectors each comprise a diode, which is connected between a current sensor and, a capacitance and resistance connected in parallel to each other, the parallel connected resistance and capacitance being connected between the diode and the reference potential.

* * * * *